United States Patent [19]

Gammack et al.

[11] Patent Number: 5,412,368
[45] Date of Patent: May 2, 1995

[54] DIGITAL SIGNAL COMPARISON CIRCUITRY

[75] Inventors: Richard J. Gammack; Catherine L. Barnaby; Anthony I. Stansfield, all of Bristol, England

[73] Assignee: Inmos Limited, Bristol, England

[21] Appl. No.: 84,418

[22] Filed: Jun. 29, 1993

[30] Foreign Application Priority Data

Jun. 30, 1992 [GB] United Kingdom ............... 9213818

[51] Int. Cl.$^6$ ........................................... G06F 7/02
[52] U.S. Cl. ........................................... 340/146.2
[58] Field of Search .................................. 340/146.2

[56] References Cited

U.S. PATENT DOCUMENTS

| | | | |
|---|---|---|---|
| 3,248,692 | 4/1966 | Shih | 340/146.1 |
| 3,623,155 | 11/1971 | Hsiao | 340/146.1 |
| 3,825,893 | 7/1974 | Bossen et al. | 340/146.1 |
| 3,949,208 | 4/1976 | Carter | 235/153 |
| 4,119,946 | 10/1978 | Taylor | 340/146.3 |
| 5,034,919 | 7/1991 | Sasai et al. | 365/49 |
| 5,181,207 | 1/1993 | Chapman | 371/37.4 |
| 5,195,098 | 3/1993 | Johnson et al. | 371/37.2 |

OTHER PUBLICATIONS

IBM Technical Disclosure Bulletin, vol. 13, No. 6, Nov. 1970, New York, pp. 1657–1658; D. Bossen "Error Checking Means for Associated Memory Map".
IEEE Journal of Solid-State Circuits, vol. SC-11, No. 5, Oct. 1976 New York, pp. 692–695, C. Mead, et al. "128-Bit Multicomparator" p. 693, left column, line 56—right column, line 1; figure 4.

*Primary Examiner*—Margaret Rose Wamrach
*Attorney, Agent, or Firm*—Felsman, Bradley, Gunter & Dillon

[57] ABSTRACT

A method of comparing a first multibit digital signal with a second multibit digital signal wherein to increase speed of obtaining an output signal said method comprises inputting input signals for each of said first and second signals and forming a respective codeword for each input signal, each codeword being at least one bit longer than the respective input signal and formed by the same error correcting code for both signals to provide increased minimum Hamming distance for the respective codewords, comparing respective bit locations of the codewords to form a plurality of match indicating signals for respective bit locations thereby indicating any mismatch by a mismatch at at least two bit locations, supplying said match indicating signals in parallel to gating circuitry arranged to provide an output indicating a match or mismatch between said codewords, said output being provided with a time delay less than that required for a single bit mismatch. The invention also provides digital signal comparison circuitry.

12 Claims, 3 Drawing Sheets

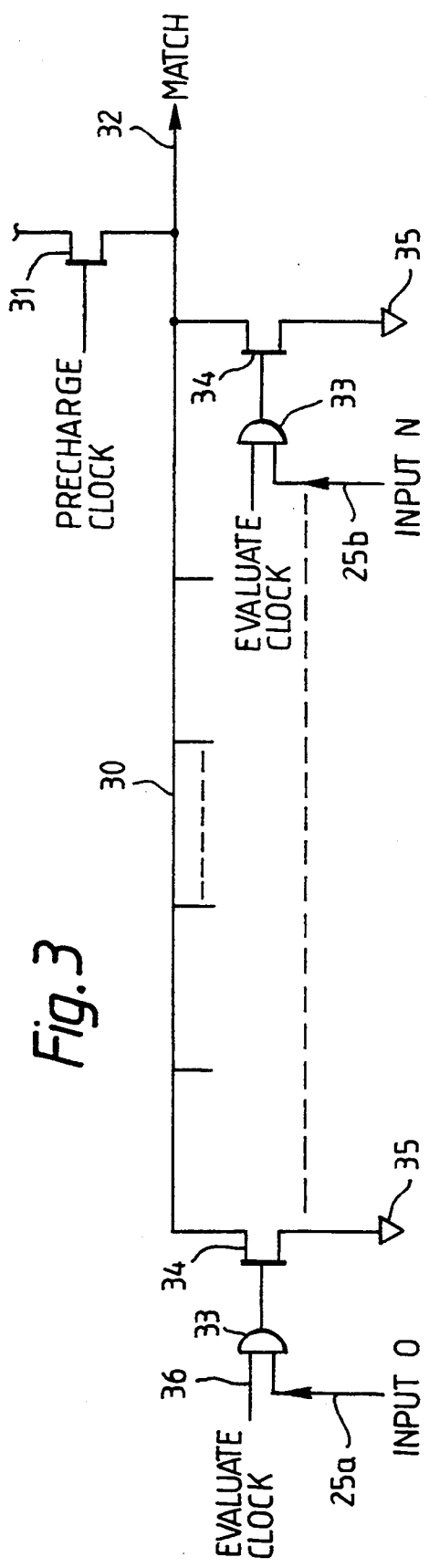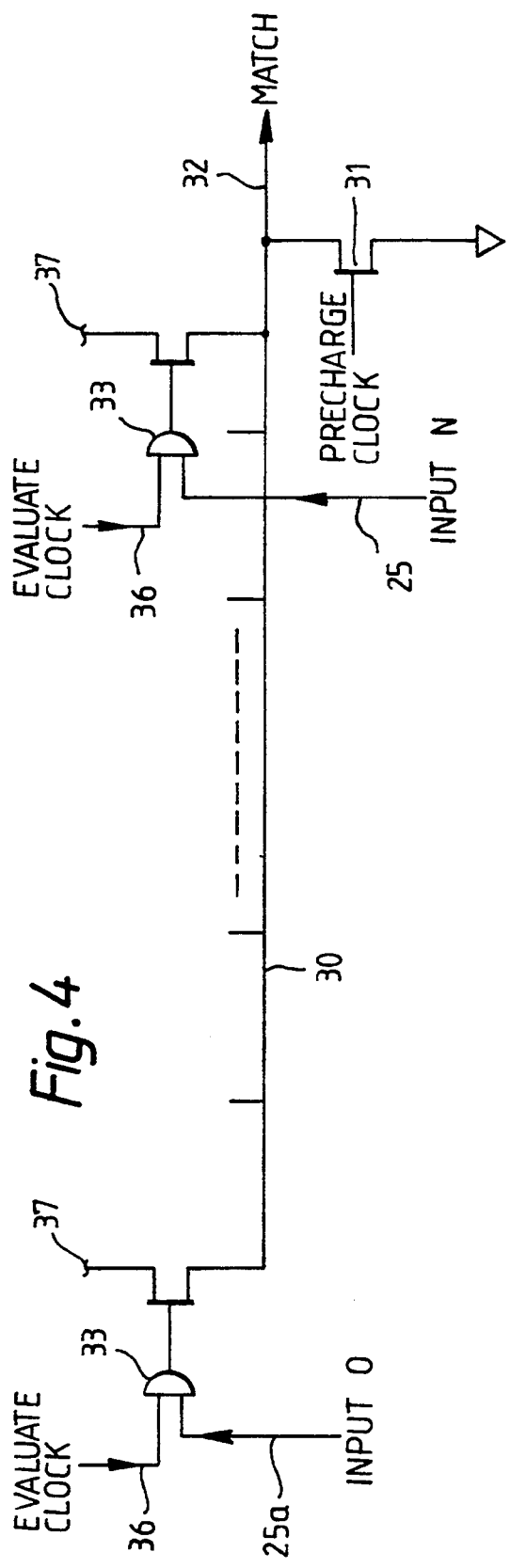

DIGITAL SIGNAL COMPARISON CIRCUITRY

DIGITAL SIGNAL COMPARISON CIRCUITRY

Invention relates to digital signal comparison circuitry, methods of comparing multibit digital signals and systems for effecting digital signal comparison at high speed.

BACKGROUND OF THE INVENTION

Circuits are known for generating a match signal when two multibit signals are compared and found to match at each location. In the event of a mismatch at any bit location circuitry is operated to change an output match signal to an output mismatch signal.

It is an object of the present invention to improve the speed of operation of digital signal comparison circuitry so that in the event of a mismatch a signal level change is more quickly generated.

SUMMARY OF THE INVENTION

The present invention provides a method of comparing a first multibit digital signal with a second multibit digital signal wherein to increase speed of obtaining an output signal said method comprises inputting input signals for each of said first and second signals and forming a respective codeword for each input signal, each codeword being at least one bit longer than the respective input signal and formed by the same error correcting code for both signals to provide increased minimum Hamming distance for the respective codewords, comparing respective bit locations of the codewords to form a plurality of match indicating signals for respective bit locations thereby indicating any mismatch by a mismatch at at least two bit locations, supplying said match indicating signals in parallel to gating circuitry arranged to provide an output indicating a match or mismatch between said codewords, said output being provided with a time delay less than that required for a single bit mismatch.

Preferably said first and second signals are supplied as inputs to respective Hamming distance enhancers, said enhancers supplying respective multibit outputs to comparison circuitry arranged to compare corresponding bit locations of each of said enhancer outputs.

Preferably respective bit locations of the codewords are compared by use of an exclusive OR circuit for each bit location of each codeword.

Preferably the gating circuitry receives a plurality of inputs corresponding respectively to each bit location of a codeword and operates to provide a single output which changes state to indicate a mismatch at a speed dependent on the number of inputs corresponding to a mismatch in the codewords.

The invention also provides digital signal comparison circuitry for comparing a first multibit digital signal with a second multibit digital signal, wherein to reduce time taken to generate an output signal said circuitry comprises Hamming distance enhancing circuitry for receiving as input signals said first and second signals and generating a respective codeword for each signal which is at least one bit longer than the respective input signal to increase the minimum Hamming distance, a comparator for comparing respective bit locations of the codewords to form a plurality of match indicating signals for respective bit locations thereby indicating any mismatch by a mismatch at at least two bit locations, and gating circuitry coupled to said comparator to receive the match indicating signals in parallel and provide an output indicating a match or mismatch between said codewords.

Preferably said comparison circuitry is connected to data processing circuitry which is time controlled to access said comparison circuitry to effect a comparison in a time delay less than that necessary for a mismatch at a single bit location.

Preferably said comparator comprises exclusive OR circuitry for each bit location of a codeword and is coupled to receive in parallel inputs from each location of both codewords.

Preferably said gating circuitry includes a single line coupled to receive a first signal level in event of a match between said codewords, and a plurality of inputs coupled to receive outputs in parallel from said comparator, each of said inputs being operable to change the signal level on said signal line to a second level in the event of a mismatch occurring at any bit location, whereby the speed of change from said first signal level to said second signal level is dependent on the number of inputs which indicate a mismatch.

BRIEF DESCRIPTION OF THE DRAWINGS

FIG. 3 shows in detail a further part of the apparatus of FIG. 1,

FIG. 4 shows an alternative embodiment showing a different form of circuit to that illustrated in FIG. 3.

DESCRIPTION OF THE PREFERRED EMBODIMENTS

Figure 1:
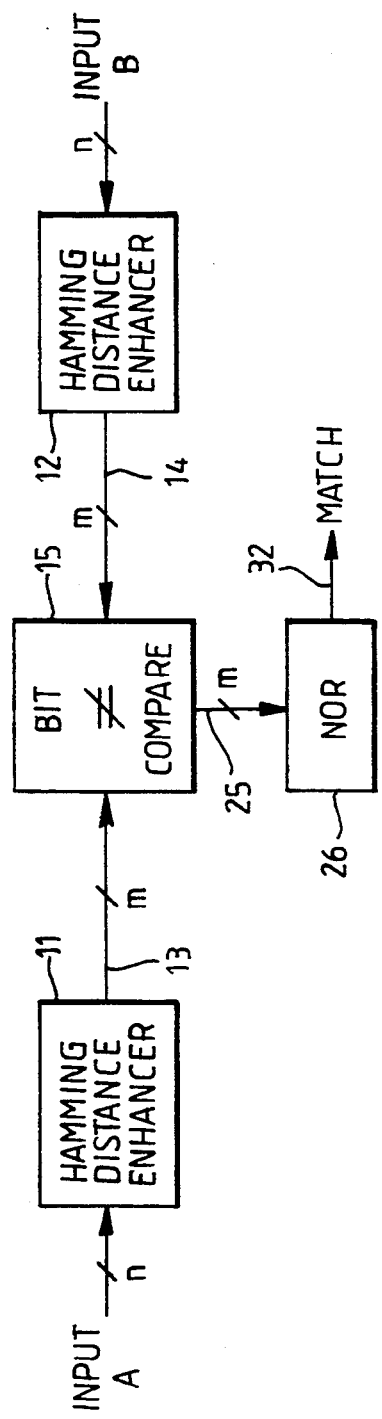
FIG. 1 is a block diagram of a first embodiment of the invention.
Figure 2:
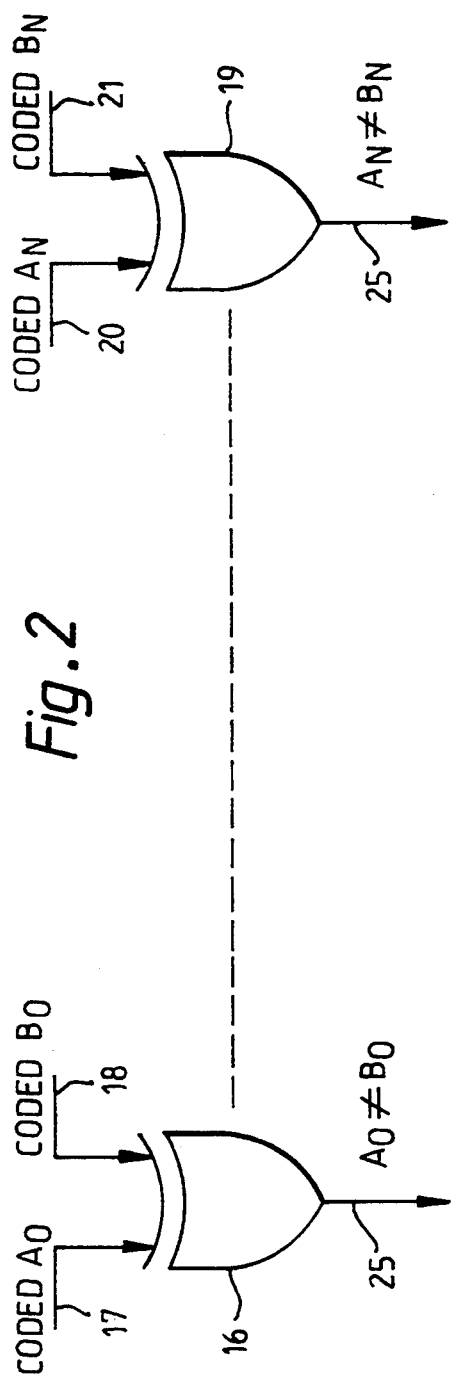
FIG. 2 shows further detail of part of the apparatus of FIG. 1.

The example of FIG. 1 provides apparatus for comparing two multibit digital signals to determine whether a match or a mismatch occurs between the two signals. The first signal forms input A and consists of n bits representing data of the first signal. The second signal also comprises n bits of data formed as input B. Input A is fed to first Hamming distance enhancer 11 whereas input B is provided as an input to a second Hamming distance enhancer 12. Each of the enhancers 11 and 12 is of similar construction and they form respective outputs 13 and 14 which consist of m bit codewords consisting of the original n bits of input data plus m-n check bits calculated by using the same error correcting code in both enhancers 11 and 12. Encoding rules are known for calculating check bits to increase the minimum Hamming distance of a multibit word. An example is a BCH code with the particular code defining the minimum Hamming distance between any two codewords. Any data item for the two inputs will be encoded according to the same error correcting code. The code may be systematic in which the data bits to be encoded appear in the corresponding codeword according to a predefined pattern (e.g. same ordering in the same set of places) but the code need not necessarily be systematic. For systematic Hamming enhancers 11 and 12 the number of check bits added may be one bit where a simple parity bit is added to indicate the parity of the data input or alternatively a plurality of check bits may be generated. The outputs 13 and 14 from the enhancers 11 and 12 form simultaneous inputs to a comparator circuit 15. This circuit is shown in more detail in FIG. 2 and comprises an exclusive OR gate for each bit location in the m bit inputs. As is shown in FIG. 2 a first exclusive OR gate 16 receives an input 17 from the least significant bit location of the input 13 together with an input 18 which represents the least significant bit of the input 14. Similarly the exclusive OR gate 19 for bit N receives an input 20 representing bit N of input 13 together with input 21 representing bit N of input 14. Each of the exclusive OR gates 16 to 19 checks the two inputs and provides an output 25 if the two inputs to the exclusive OR gate do not match. In this way a set of output signals 25 are formed for each of the m bit locations of the codewords which have been compared by the comparator 15. The respective outputs forming signal 25 will individually represent a match or a mismatch of the corresponding bit location of the codewords. These signals 25 are supplied to a NOR circuit 26 which is shown in more detail in FIGS. 3 and 4.

In the first example shown in FIG. 3 two of the signal lines 25 have been indicated as 25a and 25b. It will of course be understood that there are the same number of inputs as there are bit positions in the codewords in lines 13 and 14. The NOR circuit has a precharged line 30 which may be precharged by a precharge clock 31. When precharged the NOR circuit 26 provides an output 32 indicating a match between the two data words which were input as input A and input B. However each of the inputs 25a and 25b is connected to a respective AND gate 33 coupled to a respective transistor 34 acting as a switch to connect line 30 to earth 35. The AND gates 33 each receive a second input 36 controlled by an evaluate clock so that the gates 33 receive an evaluate input only during time periods determined by the clock. During the time that an evaluation is carried out, the gates 33 will be open to activate the associated switch 34 if the respective input 25a or 25b has indicated a mismatch for the respective bit position of the codewords compared by the circuit. This results from the use of the exclusive OR gates 16 to 19 which only provide an output on the respective line 25 if no match occurred for its bit location. In this way, transistors 34 will be switched on to discharge line 30 at any positions corresponding to a bit mismatch in the two codewords. By use of the Hamming distance enhancers 11 and 12 it is ensured that the codewords compared by the comparator 15 will either match or in the event of a mismatch the mismatch will be in at least two or more bit locations. The mismatch will never be at a single bit location.

When line 30 is precharged by the clock 31 to a first signal level indicating a match at the output 32, this signal must be changed to a second level representing a discharge state of the line 30 when any mismatch occurs. By use of the present example, any mismatch will cause at least two of the transistors 34 to be switched on to earth the line 30 and thereby speed up the rate of discharge of the line 30. It will be seen that in the circuit of FIG. 3 the rate of discharge of the line 30 is dependent on the number of transistors 34 which are switched on to discharge the line.

It will be seen from FIG. 3 that the more discharging inputs which are connected to line 30 the greater the capacitance and consequently this causes some slow down in performance. If only one input had been used to discharge the line 30 then the time to discharge would be proportional to N/1 where there are N inputs to the line but only 1 operating to discharge the line in the event of a Hamming distance of only 1. However by use of the present invention the Hamming distance always has a minimum of 2 and in the event of the use of a single check bit to increase the Hamming distance to 2 the time to discharge of the line 30 will now be proportional to $$\frac{(N+1)}{N} \times \frac{1}{2}$$

The advantage of using the Hamming distance enhancers 11 and 12 is substantial in the case of data words having a substantial bit length such as 32 bits. In that case the capacitance factor is only increased from 32 to 33 in the event of doubling the minimum Hamming distance from 1 to 2 but the evaluation time in determining a valid output from output 32 is dropped considerably by the use of at least two discharging transistors 34.

An alternative to the example shown in FIG. 3 is illustrated in FIG. 4. In this case similar reference numerals have been used for similar parts. Instead of the line 30 being precharged, it is normally earthed by use of the clock controlling transistor 31. In the event of mismatch occurring on any of the inputs 25, the AND gates 33 of those inputs will now be operated during the evaluate period to charge the line 30 from a voltage supply line 37. The increase speed of charging the line by use of the check bits to increase the minimum Hamming distance will be the same as already described with reference to FIG. 3.

Figure 5:
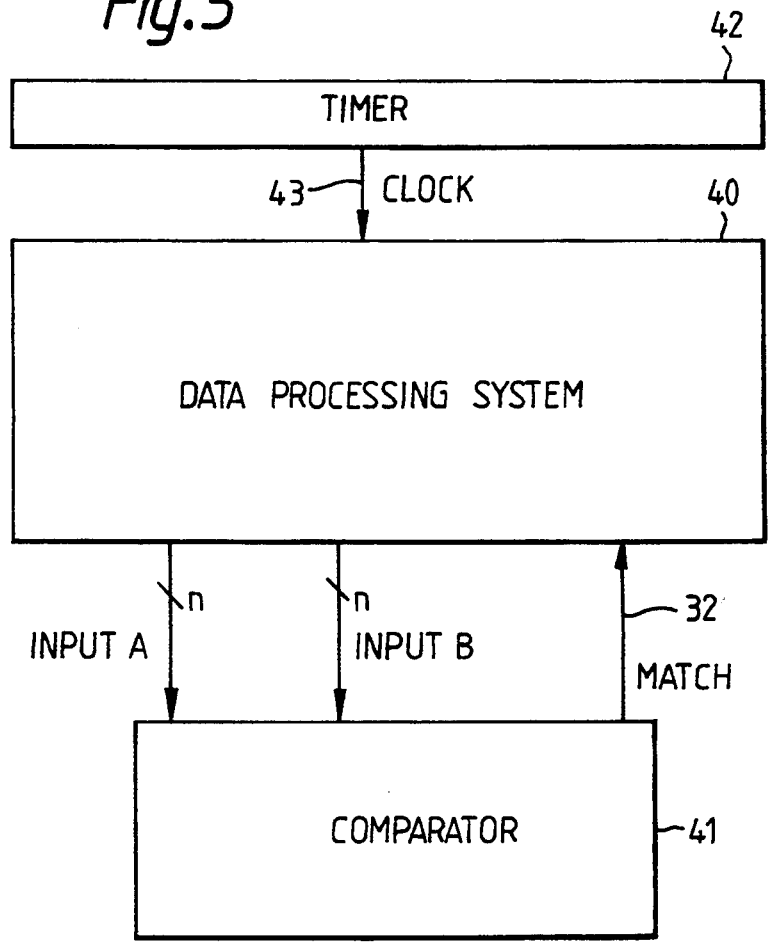
FIG. 5 is a block diagram of a data processing system using the apparatus of FIG. 1.
Figure 6:
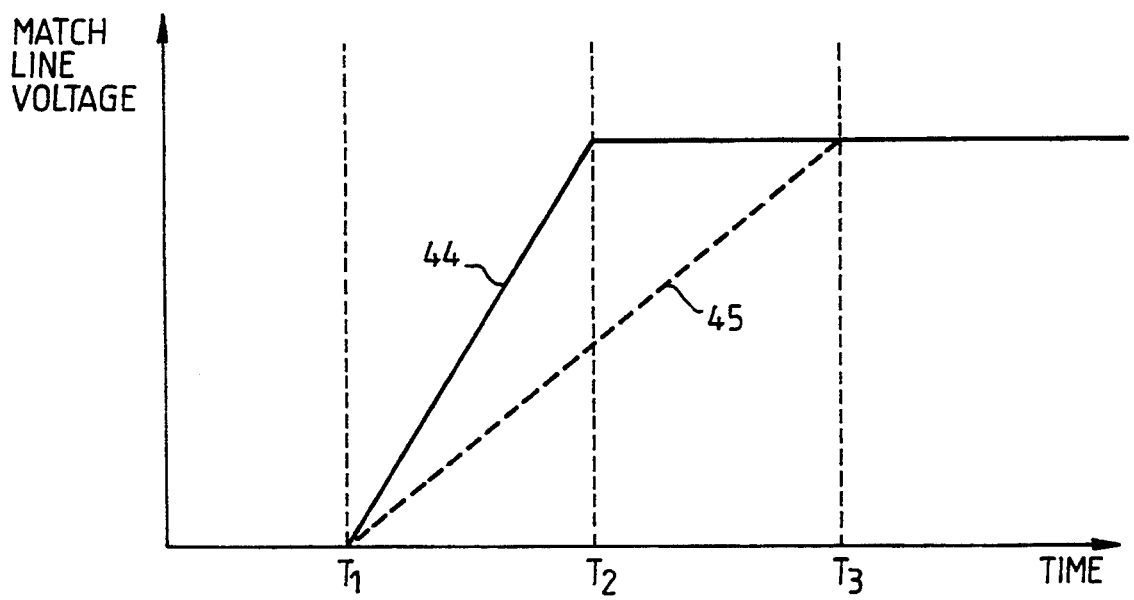
FIG. 6 is a timing diagram showing the increased speed of operation obtained with the present embodiments of the invention.

In FIG. 5 a data processing system 40 is coupled to the comparator circuitry 41 which is the same as the apparatus described in FIG. 1 and similar reference numerals have been used for similar parts. In this case the data processing system 40 operates on time cycles controlled by clock pulses 43 from a timer 42. The data processing system 40 is set up to control the frequency of successive access operations to the comparator 41 so as to allow sufficient time for each access operation to cover the worst case of time delay for that comparison operation. Each comparison operation by the processing system 40 allocates a delay of clock pulses sufficient to allow change in signal level on the match line 32 for the worst case which occurs when a mismatch occurs at a single data bit location. FIG. 6 shows the time delays in change of signal level on the match line 32 for the present invention (line 44) and for a prior art comparator (line 45). When a data comparison is made and a mismatch occurs the voltage on the match line 32 starts to change at $T_1$ in FIG. 6. In the prior art as shown by line 45, the rate of change may be relatively slow and it is only at time $T_3$ that the voltage has fully changed from a first state to a second state if a mismatch occurred at a single data bit. Consequently a data processing system using such a prior art comparator must allow delay between $T_1$ and $T_3$ before carrying out a next comparison operation. In the present invention, any mismatch will always involve at least two data bits so the slowest change in signal level occurs between $T_1$ and $T_2$ as shown in FIG. 6. This change in rate allows the processing system 40 to be arranged to access the comparator 41 at twice the frequency of the prior art. In the example shown in FIG. 5, the data processing system 40 is set up to access the comparator 41 at a frequency corresponding to any mismatch occurring at at least two data bit locations. This frequency is higher than that which would be possible where the output of the comparator 41 has to accommodate a mismatch at a single location.

The invention is not limited to the details of the foregoing examples. In particular other NOR circuits 26 may be used. Instead of using charging or discharging between two different voltage levels current sensing systems may be used in which the current flow in a line is varied to indicate a match or a mismatch and the rate of response in current change sensed depends on the number of inputs where a mismatch occurs.

In FIG. 1 the outputs of the enhancers 11 and 12 may be loaded into buffer circuits before comparison.

Although the codewords described above are formed by adding one or more check bits to a plurality of data bits, the enhancers 11 and 12 may be arranged to generate codewords in which the data is encoded in other ways which still provide a codeword of greater bit length than the input and having an enhanced minimum Hamming distance (that is the minimum number of bit locations by which any two different words will differ).

We claim:

1. A method of comparing a first multibit digital signal with a second multibit digital signal wherein to increase speed of obtaining an output signal said method comprises inputting input signals for each of said first and second signals and forming a respective codeword for each input signal, each codeword being at least one bit longer than the respective input signal and formed by a common error correcting code for both signals to provide increased minimum Hamming distance for the respective codewords, comparing respective bit locations of the codewords to form a plurality of match indicating signals for respective bit locations thereby indicating any mismatch by a mismatch at at least two bit locations, supplying said match indicating signals in parallel to gating circuitry arranged to provide an output indicating a match or mismatch between said codewords, said output being provided with a time delay less than that required for a single bit mismatch.

2. A method according to claim 1 in which each comparison operation is time controlled by data processing circuitry arranged to effect a digital signal comparison within a time delay less than that required for a single bit mismatch.

3. A method according to claim 1 in which said first and second signals are supplied as inputs to respective Hamming distance enhancers, said enhancers supplying respective multibit outputs to comparison circuitry arranged to compare corresponding bit locations of each of said enhancer outputs.

4. A method according to claim 1 in which signals from each bit location of each codeword are compared in respective exclusive OR circuitry.

5. A method according to claim 1 in which the gating circuitry receives a plurality of inputs corresponding respectively to each bit location of a codeword and operates to provide a single output which changes state to indicate a mismatch at a speed dependent on the number of inputs corresponding to a mismatch in the codewords.

6. A method according to claim 1 in Which each codeword comprises data for the respective input signal and at least one check bit.

7. A method according to claim 6 in which each codeword includes a single parity check bit.

8. A method according to claim 6 in which each codeword includes a plurality of check bits.

9. Digital signal comparison circuitry for comparing a first multibit digital signal with a second multibit digital signal, wherein to reduce time taken to generate an output signal said circuitry comprises Hamming distance enhancing circuitry for receiving as input signals said first and second signals and generating a respective codeword for each signal which is at least one bit longer than the respective input signal and has an increased Hamming distance, a comparator for comparing respective bit locations of the codewords to form a plurality of match indicating signals for respective bit locations thereby indicating any mismatch by a mismatch at at least two bit locations, and gating circuitry coupled to said comparator to receive the match indicating signals in parallel and provide an output indicating a match or mismatch between said codewords.

10. Digital signal comparison circuitry as claimed in claim 9 connected to data processing circuitry which is time controlled to access said comparison circuitry to effect a comparison in a time delay less than that necessary for a mismatch at a single bit location.

11. Digital signal comparison circuitry according to claim 9 in which said comparator comprises exclusive OR circuitry for each bit location of a codeword and is coupled to receive in parallel inputs from each location of both codewords.

12. Digital signal comparison circuitry according to claim 8 in which said gating circuitry includes a signal line coupled to receive a first signal level in the event of a match between said codewords, and a plurality of inputs coupled to receive outputs in parallel from said comparator, each of said inputs being operable to change the signal level on said signal line to a second level in the event of a mismatch occurring at any bit location, whereby the speed of change from said first signal level to said second signal level is dependent on the number of inputs which indicate a mismatch.

* * * * *